(12) United States Patent
Yamaguchi

(10) Patent No.: US 8,284,148 B2
(45) Date of Patent: Oct. 9, 2012

(54) CLOCKLESS TRANSMISSION SYSTEM AND CLOCKLESS TRANSMISSION METHOD

(75) Inventor: Kouichi Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 663 days.

(21) Appl. No.: 12/530,549

(22) PCT Filed: Feb. 27, 2008

(86) PCT No.: PCT/JP2008/053371
§ 371 (c)(1),
(2), (4) Date: Sep. 9, 2009

(87) PCT Pub. No.: WO2008/111395
PCT Pub. Date: Sep. 18, 2008

(65) Prior Publication Data
US 2010/0039156 A1    Feb. 18, 2010

(30) Foreign Application Priority Data
Mar. 9, 2007    (JP) ................ 2007-059292

(51) Int. Cl.
G09G 3/38    (2006.01)
(52) U.S. Cl. .......................................... 345/98; 345/100
(58) Field of Classification Search ............. 345/98–100, 345/204
See application file for complete search history.

(56) References Cited

U.S. PATENT DOCUMENTS

| | | | |
|---|---|---|---|
| 5,610,954 A * | 3/1997 | Miyashita et al. | ............ 375/375 |
| 2007/0030225 A1* | 2/2007 | Moon et al. | ............ 345/89 |
| 2007/0164883 A1* | 7/2007 | Furtner | ............ 341/126 |

FOREIGN PATENT DOCUMENTS

| | | |
|---|---|---|
| JP | 62-102636 A | 5/1987 |
| JP | 04-240936 A | 8/1992 |
| JP | H0795194 | 4/1995 |
| JP | 08-191294 A | 7/1996 |
| JP | 08-263020 A | 10/1996 |
| JP | H08288936 | 11/1996 |
| JP | 09-044122 A | 2/1997 |
| JP | 09-182100 A | 7/1997 |
| JP | 10-178343 A | 6/1998 |
| JP | H1188187 | 3/1999 |
| JP | 2001-345964 A | 12/2001 |

(Continued)

OTHER PUBLICATIONS

Japanese Office Action for JP2009-503958 mailed on Jun. 12, 2012.

(Continued)

*Primary Examiner* — Jimmy H Nguyen

(57) ABSTRACT

A clockless transmission system includes display controller 101 and display driver 106. Display controller 101 includes data transmission circuit 102 configured to output general data obtained by multiplexing a clock by coding serialized pixel data for each pixel data during a data communication interval and also to output a predetermined control signal during a blanking interval. Display driver 106 includes clock and data recovery circuit 107 configured to output the pixel data from the general data transferred from the display controller and to increase a loop gain of a feedback loop in clock recovery such that the loop gain is larger than that when the general data is received, according to control data of the control signal, to recover and output a clock, and display driving circuit 109 configured to output a signal for driving a display based on the pixel data and the recovered clock.

13 Claims, 6 Drawing Sheets

FOREIGN PATENT DOCUMENTS

| | | |
|---|---|---|
| JP | 200209745 A | 1/2002 |
| JP | 2004-234808 A | 8/2004 |
| JP | 2004-328063 A | 11/2004 |
| JP | 2005-311879 A | 11/2005 |

OTHER PUBLICATIONS

International Search Report for PCT/JP2008/053371 mailed Apr. 1, 2008.

* cited by examiner

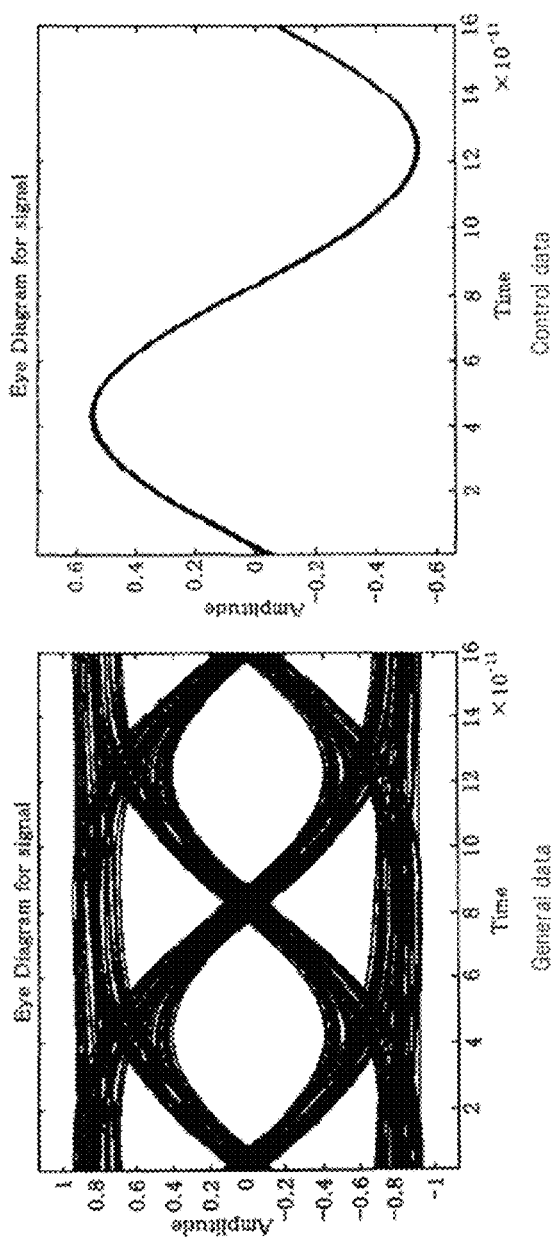

CLOCKLESS TRANSMISSION SYSTEM AND CLOCKLESS TRANSMISSION METHOD

TECHNICAL FIELD

The present invention relates to a clockless transmission system and clockless transmission method capable of ensuring synchronization between a recovered clock in a clock and data recovery circuit and an input signal even in an environment in which much noise is generated such as when a display driving circuit or the like operates.

BACKGROUND ART

Recently, as flat panel displays are increased in size, the amount of data to be supplied to a display driver from a display controller increases. For example, for a UXGA (1920×1200) display, data need to be supplied to each pixel at the intervals of (1920+180)*(1200+300)*60 Hz=189 MHz (180 and 300 correspond to blanking intervals). Accordingly, the amount of data to be supplied to the display driver reaches 6.8 Gbit (189 MHz*12 bit*3(RGB)) per second.

As a high speed interface (IF) technique for the display driver, RSDS (Reduced Swing Differential Signaling) or Mini-LVDS (Low Voltage Differential Signaling) has been known. In the RSDS, data of about 170 Mbit is transmitted via bus-connected transmission paths having 12 to 15 channels. The Mini-LVDS is a data transmission scheme in which transmission paths of 3 to 6 channels are connected in a point-to-point manner, and data and a clock are supplied to a receiving side.

However, the RSDS has a problem in that, because impedance mismatching occurs at the bus-connected transmission paths, the transmission speed is limited by multi-reflection of signals. In addition, the Mini-LVDS has a problem in that the transmission speed is limited by the skew of the clock signal and the data signal that run parallel. Thus, in case of using such transmission methods, the number of channels should be increased for a large capacity, inevitably resulting in an increase in the costs of a transmission medium due to multi-layered substrate or the like.

In an effort to solve such problems, a clockless transmission using a clock and data recovery circuit has received much attention in the area of a high speed interfaces for display drivers.

FIG. 1 is a block diagram showing the configuration of a related clockless transmission system applied to an interface for a display driver. The clockless transmission system includes display controller 501, transmission medium 504, and display driver 506.

In FIG. 1, display controller 501 serializes image data and performs coding, such as 8B10B coding, to convert R, G, and B pixel data each having 8 bits into a 10-bit signal. Data transmission circuit 502 transmits general data obtained by multiplexing a clock signal through coding, as output signal 503, to transmission medium 504.

In display driver 506, clock and data recovery circuit 507 recovers the clock signal from the general data inputted as input signal 505 from transmission medium 504 and outputs the same, and separates the pixel data from the coded signal and outputs it. Display driving circuit 508 outputs the recovered clock signal and the separated pixel data to a display (not shown).

With such configuration, the skew problem of the clock signal and the pixel data signal is solved, enabling high speed signal transmission. In addition, because the number of channels can be reduced by serialization and high speed transmission, the clockless transmission expectedly allows reduction in the costs of the transmission medium.

However, when clock and data recovery circuit 507 in the clockless transmission system is applied to the interface for the display driver as shown in FIG. 1, clock and data recovery circuit 507 suffers from power supply noise that is generated by display driving circuit 508 of display driver 506.

FIG. 2 illustrates the operation of the clockless transmission system of FIG. 1, showing a phase relationship between the input signal and the recovered clock (half rate) before and after power supply noise.

In general, as shown in FIG. 2(a), the operation of display driver 506 is divided into data communication intervals, during which data to be displayed on a display is received, and into blanking intervals during which pixels of the received data are written in the display, which are repeated.

As shown in FIG. 2(b), display driving circuit 508 performs writing of the pixel data after one row of pixel data handled by display driver 506 is completely received. At this time, display driving circuit 508 consumes much current in writing the pixel data, generating much power supply noise.

Affected by the power supply noise, a clock phase of an oscillation circuit for generating the recovered clock included in clock and data recovery circuit 507 is greatly changed as shown in FIG. 2(c). Namely, before the power supply noise is generated, the input signal and the recovered clock are in synchronization, but after the power supply noise is generated, the input signal and the recovered clock are not synchronized any longer. This brings about an error, when a front bit of pixel data to be written on the display is received, after the blanking interval ends.

Over the problem, in an optical disk device disclosed in patent document 1, an error pattern detection circuit detects an error of a pattern length of recovered signal S1 read from an optical disk and outputs detect signal S2 indicating the amount of detection. A gain control circuit generates control signal S3 according to detect signal S2, and when the detection amount that is indicated by detect signal S2 is increased, the gain control circuit reduces an open loop gain of a PLL circuit. Through such operation, when the reliability of recovered signal S1 is low, the PLL circuit can hardly follow recovered signal S1 and jitter of the generated clock is restrained from increasing, and the PLL circuit supplies a stable clock, and thus, a decoding error of the recovered signal S1 is reduced.

In this manner, patent document 1 has as its object reducing the decoding error of the recovered signal resulting from a scar or dirt in the optical disk in the optical disk device.

However, patent document 1 does not disclose prevention of an error generated based on power supply noise in a clockless transmission system.

In a serial data receiving circuit disclosed in patent document 2, a PLL circuit generates a multi-phase clock from an input clock. An over-sample circuit over-samples input serial data during a blanking interval. A sampling clock selection circuit selects one sampling clock, given an optimum phase from among the multi-phase clocks generated by the PLL circuit, and captures data by single sampling using the selected single sampling clock during a non-blanking interval.

Patent document 2 describes the objective of seeking low power consumption and size reduction by accurately confirming data with the smaller number of samplings in the multi-channel high speed serial transmission system in which a timing skew is generated between channels.

However, patent document 2 does not disclose prevention of an error generated based on power supply noise in a clockless transmission system.

A light transmission apparatus disclosed in patent document 3 includes an FIFO for storing a plurality of digital image signals outputted from a host device, and a transmission means including a packet generator, a 8B10B encoder, and a light transmitter devised for reading the plurality of digital image signals stored in the FIFO in order, converting them into light signals, and sequentially transmitting the converted light signals to an image display device via a communication path formed of an optical fiber. The transmission means transmits the digital image signals stored in the FIFO during a period during which a horizontal synchronization signal for counting timing in a horizontal direction is to be transmitted to an image display device when the image display device draws a screen image. Accordingly, the transmission band can be reduced and the optical transmission system can be reduced in size.

In this manner, patent document 3 describes the objective of making the system small by narrowing the transmission band required for optically transmitting the digital signals.

However, patent document 3 does not disclose prevention of an error generated based on power supply noise in a clockless transmission system.

In a liquid crystal display system described in patent document 4, a PERSONAL COMPUTER makes a dot.clock.burst generated from a video signal output unit overlap with a horizontal synchronization signal, and supplies them as a composite synchronization signal to a liquid crystal display (LCD) device. The LCD device extracts the dot.clock.burst from the composite synchronization signal and reproduces a dot.clock based on the dot.clock.burst.

Patent document 4 describes the objective of supplying the signal for generating the dot.clock to a liquid crystal panel without the necessity of drastically changing the specification at the PERSONAL COMPUTER. Also, it describes the objective of simply generating the dot.clock at the liquid crystal panel and obtaining image display by using the stable liquid crystal panel without dot flickering or image shaking.

However, patent document 4 does not disclose prevention of an error generated based on power supply noise in a clockless transmission system.

In a PLL circuit described in patent document 5, the gain of a phase loop of a PLL that generates a clock signal such that it is synchronized with a color burst signal is controlled to be lowered during a vertical blanking period.

In this manner, patent document 5 describes the objective of restraining the frequency change of the clock signal generated during the period in which the color burst signal of the composite image signal does not exist, without delaying transitional clock pull-in, in the PLL circuit for receiving the color burst signal and the decoded image signal with the vertical blanking period, and extracting the clock signal in synchronization with the color burst signal.

However, patent document 5 does not disclose prevention of an error generated based on power supply noise in a clockless transmission system.

A PLL loop filter switching circuit disclosed in patent document 6 includes a plurality of NPN and PNP resistor-installed transistors operating as switches for switching a plurality of constants of a loop filter of a PLL circuit including a resistor and a capacitor for each input signal methods, and a logical circuit for determining conditions for case classifying. In this document, an input signal method is detected and the plurality of constant values of the PLL loop filter are automatically switched to optimum values for each condition.

In particular, patent document 6 describes the objective of minimizing clock jitter that significantly affects screen quality according to a target input signal, in case of a configuration in which analog RGB signals inputted from an external source are sampled to be controlled by an A/D converter that uses a signal generated in the PLL circuit as a clock.

However, patent document 6 does not disclose prevention of an error generated based on power supply noise in a clockless transmission system.

As described above, when the general clock and data recovery circuit is applied to the interface for the display driver, synchronization between the recovered clock of the clock and data recovery circuit and the input signal is lost due to power supply noise generated from the display driving circuit in the display driver.

Patent document 1: Japanese Laid Open Publication No. 2004-234808 (Claim 1, [0038], [0050], Claim 15))

Patent document 2: Japanese Laid Open Publication No. 2004-328063 ([0022], [0030])

Patent document 3: Japanese Laid Open Publication No. 2005-311879 ([0053]

Patent document 4: Japanese Laid Open Publication No. H9-044122 ([0013], [0018], FIG. 30)

Patent document 5: Japanese Laid Open Publication No. H09-182100 (Claim 1, FIG. 2, [0029])

Patent document 6: Japanese Laid Open Publication No. H10-178343 ([0019], Claim 1, [0019], [0024], Claim 4, [0018])

DISCLOSURE OF THE INVENTION

An object of the present invention is to provide a clockless transmission system and a clockless transmission method for solving the above-described problems.

In order to solve the above problems, a clockless transmission system includes:

a display controller; and a display driver, wherein the display controller includes a data transmission circuit configured to output general data obtained by multiplexing a clock by coding serialized pixel data for each pixel data during a data communication interval and also to output a predetermined control signal during a blanking interval, and the display driver includes a clock and data recovery circuit configured to output the pixel data from the general data transferred from the display controller and to increase the loop gain of a feedback loop in clock recovery such that the loop gain is larger than that when the general data is received, according to control data of the control signal, and to recover and output a clock, and a display driving circuit configured to output a signal for driving a display based on the pixel data and the recovered clock.

To solve the above problems, there is also provided a clockless transmission method executed by a clockless transmission system, including:

outputting general data obtained by multiplexing a clock by coding serialized pixel data for each pixel data during a data communication interval and also outputting a predetermined control signal during a blanking interval, in a display controller; and driving a display by outputting, by a clock and data recovery circuit, the pixel data from the general data in an input signal transferred from the display controller, and by recovering and outputting a clock by increasing the loop gain of a feedback loop for clock recovery such that the loop gain is larger than that when the general data is received according to control data of the control signal, in a display driver.

According to the invention, because the clockless transmission system has high noise tolerance, although power supply noise or the like is generated due to the operation of the display driving circuit, synchronization between a recovered clock in the clock and data recovery circuit and an input signal is not lost and a high speed signal transmission can be performed.

BRIEF DESCRIPTION OF THE DRAWINGS

FIG. 6 is a diagram showing an eye representation of input signals of the clock and data recovery circuit according to an exemplary embodiment of the present invention.

BEST MODE FOR CARRYING OUT THE INVENTION

Preferred exemplary embodiments of the present invention will now be described with reference to the accompanying drawings.

Figure 3:
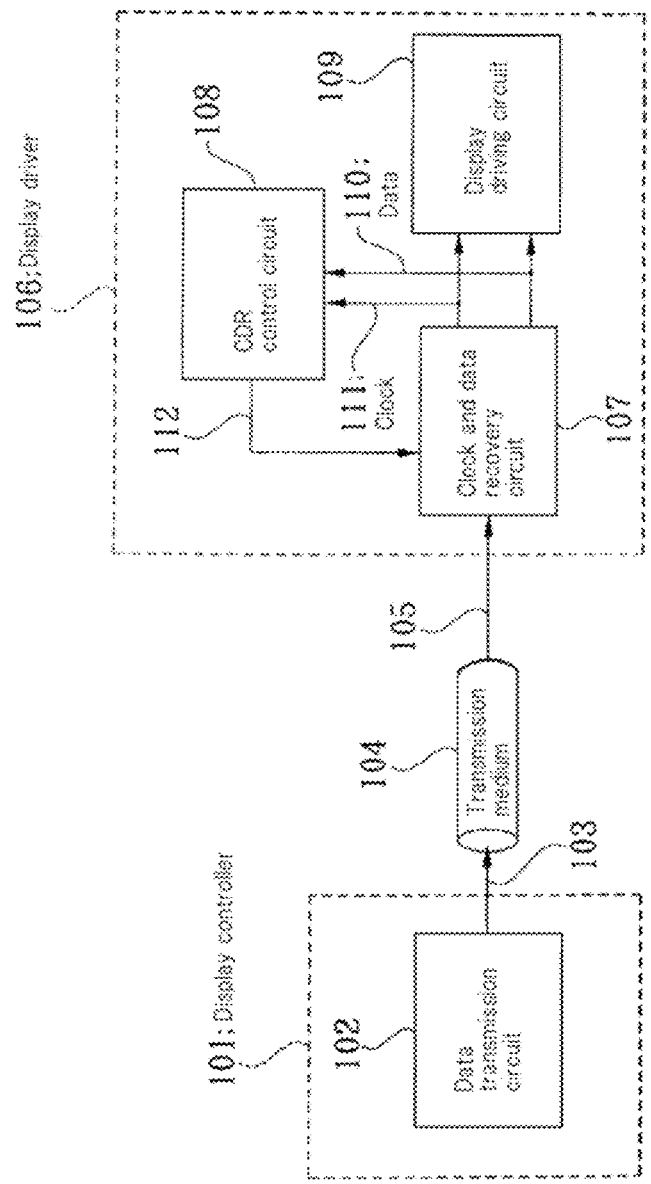
FIG. 3 is a block diagram showing the configuration of a clockless transmission system according to an exemplary embodiment of the present invention.
Figure 4:
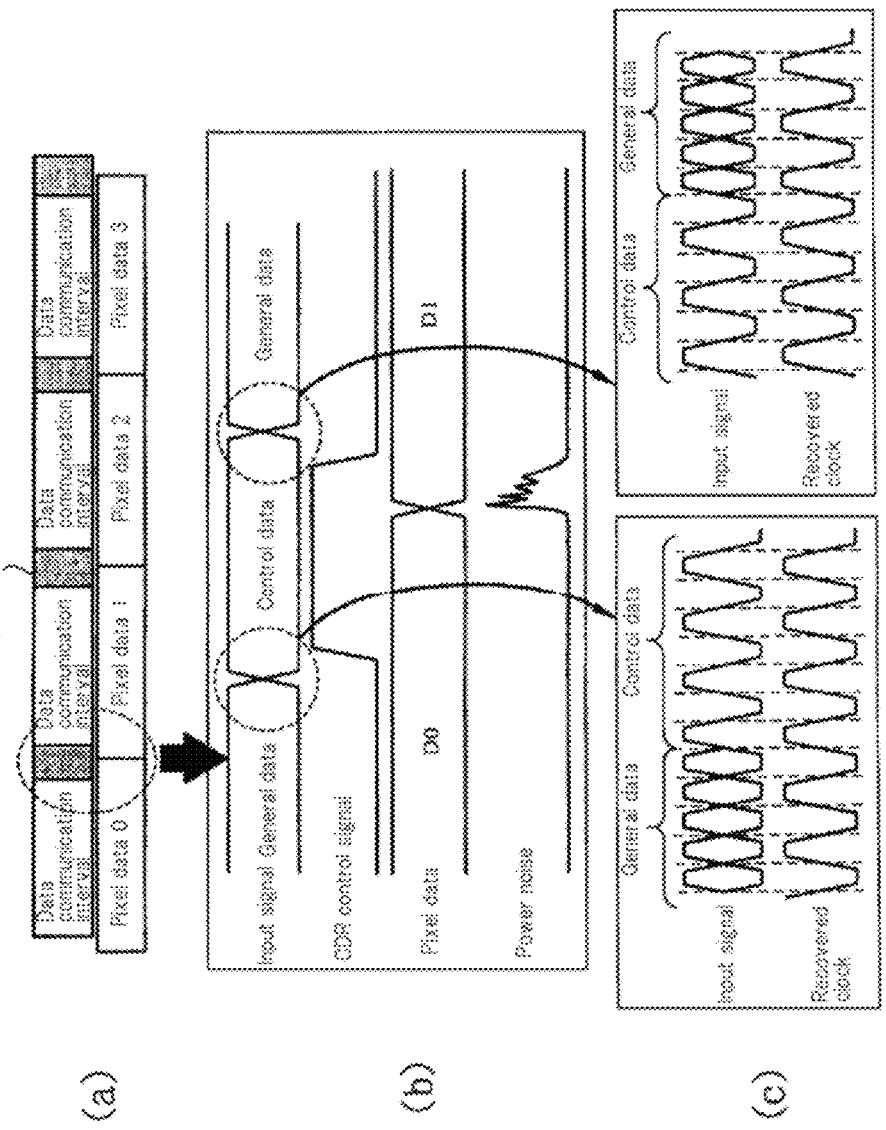
FIG. 4 is a timing chart for explaining the operation of the clockless transmission system according to an exemplary embodiment of the present invention.
Figure 5:
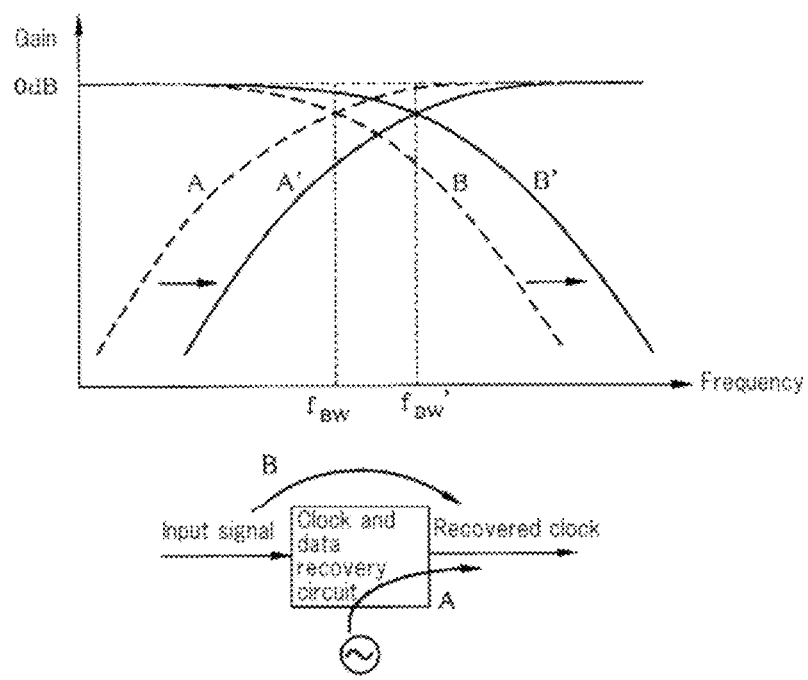
FIG. 5 is a diagram showing closed loop characteristics of a clock and data recovery circuit according to an exemplary embodiment of the present invention.

FIG. 3 is a block diagram showing the configuration of a clockless transmission system according to an exemplary embodiment of the present invention. FIG. 4 is a timing chart for explaining the operation of the clockless transmission system according to an exemplary embodiment of the present invention. FIG. 5 is a diagram showing closed loop characteristics of a clock and data recovery circuit according to an exemplary embodiment of the present invention. FIG. 6 is a diagram showing an eye representation of input signals of the clock and data recovery circuit according to an exemplary embodiment of the present invention.

As shown in FIG. 3, a clockless transmission system according to this exemplary embodiment includes display controller 101, transmission medium 104, and display driver 106. Display controller 101 includes data transmission circuit 102. Display driver 106 includes clock and data recovery circuit 107, CDR control circuit 108, and display driving circuit 109.

In display controller 101, data transmission circuit 102 transmits general data obtained by multiplexing a clock by performing coding, such as 8B10B coding or the like, on serialized image data, and a predetermined control signal as output signal 103 to transmission medium 104.

In display driver 106, clock and data recovery circuit 107 outputs reception data 110 from the general data which has been inputted as input signal 105 from transmission medium 104, and also recovers and outputs clock 111. In addition, when CDR control signal 112 is received from CDR (Clock & Data Recovery) control circuit 108, clock and data recovery circuit 107 increases the loop gain in clock recovery such that it is larger than when the general data is received. When CDR control circuit 108 detects reception of the control signal from reception data 110 transferred from clock and data recovery circuit 107, it supplies CDR control signal 112 to clock and data recovery circuit 107. Display driving circuit 109 outputs pixel data of reception data 110 and a signal for driving a display (not shown) by recovered clock 111. For example, if the display is an active matrix type liquid crystal display, scan line signals as digital signals for selecting pixels and data line signals obtained by making digital pixel data corresponding to each pixel analog signal are outputted as signals required for controlling the active matrix type liquid crystal display.

The operation of the clockless transmission system as shown in FIG. 3 will now be described with reference to the timing chart as shown in FIG. 4.

Figure 1:
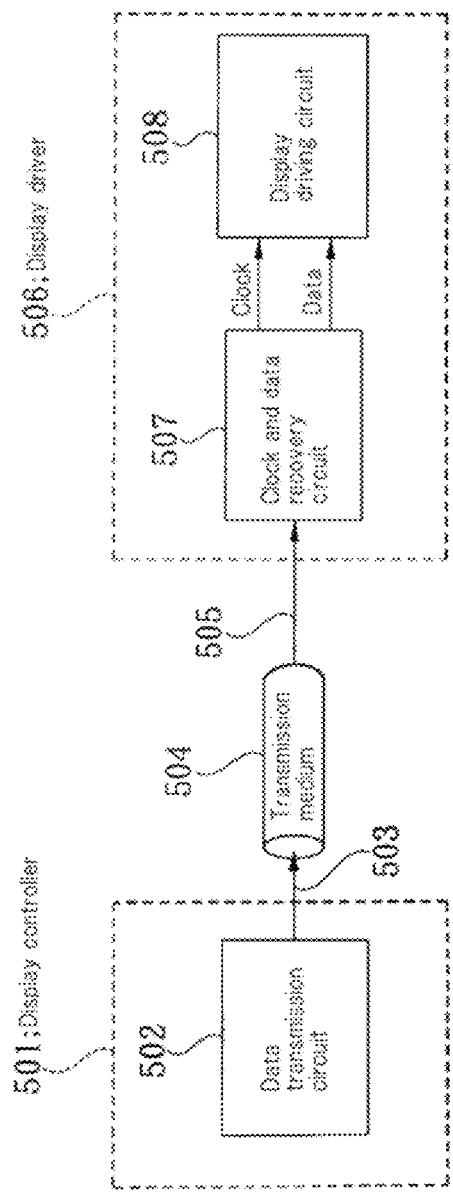
FIG. 1 is a block diagram showing the configuration of a related clockless transmission system.
Figure 2:
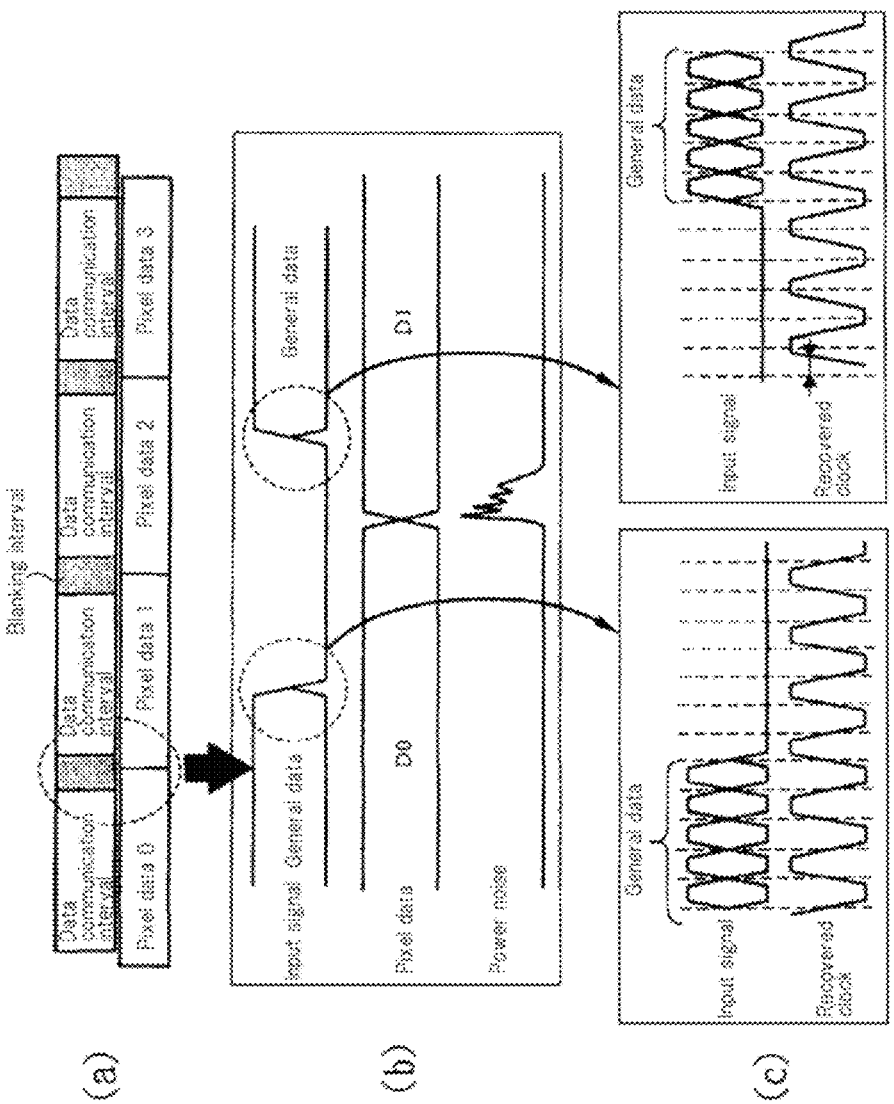
FIG. 2 is a timing chart for explaining the operation of the related clockless transmission system.

Like the clockless transmission system as shown in FIG. 1, display driver 106 according to this exemplary embodiment alternately repeats data communication intervals and blanking intervals as shown in FIG. 4(a). In the clockless transmission system according to this exemplary embodiment, however, data transmission circuit 102 transmits a predetermined control signal during the blanking period.

Here, in case of using 8B10B coding for clock multiplexing, general data and control data may be uniquely discriminated by adopting control data, configured as a special character, as a control signal, as shown in FIG. 4(b).

In the general data, for example, 8B10B-coded RGB data are sequentially and serially arranged.

Next, in the display driver 106, when CDR control circuit 108 detects reception of the control signal based on reception data 110 outputted from clock and data recovery circuit 107, it provides CDR control signal 112 to clock and data recovery circuit 107. Upon receiving CDR control signal 112, clock and data recovery circuit 107 increases the loop gain in clock recovery such that the loop gain is larger than when the general data is received.

At this time, as the special character that is adopted as the control data, for example, toggle signal data including repeated 12-bit [010101 . . . ] which has the same number of bits as the pixel data is used. When the toggle signal data is received, CDR control circuit 108 controls clock and data recovery circuit 107 to increase the loop gain in clock recovery to become twice the amount of that when the general data is received.

Here, if a PLL (Phase Locked Loop) type clock and data recovery circuit using a charge pump and a VCO (Voltage Controlled Oscillator) is taken as an example, an open loop gain H(s) is represented by the equation shown below:

$$H(s) = K_{VCO} I_{CP} (R + 1/sC) \qquad (1)$$

Here, $K_{VCO}$ is the gain of the VCO, $I_{CP}$ is the amount of injected current of the charge pump, R is the resistance of the loop filter, and C is the capacity of the loop filter.

Thus, the gain of the open loop can be varied by changing the setting of $K_{VCO}$ and $I_{CP}$.

Closed loop transfer functions before and after increasing the open loop gain are as shown in FIG. 5.

In FIG. 5, A is a transfer function between a phase shift generated within the clock and data recovery circuit and the phase of the recovered clock, and A exhibits the characteristics of a high pass filter represented by equation shown below:

$$A = 1/(1 + H(s)) \qquad (2)$$

Here, B is a transfer function between jitter of the input signal and the phase of the recovered clock, and B exhibits the characteristics of a low pass filter represented by equation shown below:

$$B = H(s)/(1 + H(s)) \qquad (3)$$

As shown in FIG. 5, by increasing the open loop gain H(s), a stop band of the high pass filter with respect to an internal noise component can be increased from $f_{BW}$ to $f_{BW}'$. Accordingly, the influence of the phase shift within clock and data recovery circuit 107 resulting from power supply noise or the like can be reduced, and as shown in FIG. 4(c), synchronization between the input signal and the recovered clock is maintained before and after the power supply noise.

Here, a problem arises in that the increase in the open loop gain leads to an increase in the pass band $f_{BW}$ of the low pass filter with respect to the external noise component. Namely, the influence of the jitter component included in the input signal on the recovered clock signal is increased.

In this respect, however, the input signal is the control data at the interval in which the band $f_{BW}$ of clock and data recovery circuit 107 is high.

As shown in FIG. 6, compared to the general data, random data, and the jitter component of the control data with a fixed pattern is small. Thus, in the clockless transmission system according to this exemplary embodiment, although the gain of clock and data recovery circuit 107 is selectively increased in inputting the control data, the influence of the jitter component of the input signal resulting from the increased gain is small.

In this manner, in the clockless transmission system according to this exemplary embodiment, because data transmission circuit 102 transmits the predetermined control signal during the blanking interval, the open loop gain in clock recovery can be increased to be larger than when the general data is received at clock and data recovery circuit 107 and CDR control circuit 108 of display driver 106.

In this manner, by increasing the stop band $f_{BW}$ of the high pass filter with respect to the internal noise component, the influence of the phase shift within clock and data recovery circuit 107 resulting from power supply noise or the like can be reduced. Meanwhile, the jitter component of the control data with the fixed pattern is so small that the influence of the jitter component in the input signal is small even if the gain of clock and data recovery circuit 107 is selectively increased in inputting the control data.

While the invention has been shown and described with reference to the exemplary embodiments and examples, it will be understood by those skilled in the art that the invention is not limited thereto and that various changes may be made thereto without departing from the spirit and scope of the invention as defined by the following claims. For example, the circuit configuration of the clockless transmission system as shown in FIG. 3 is merely illustrative and it may have any other circuit configurations as long as they accomplish the same function and operation.

This application is the National Phase of PCT/JP2008/053371 filed on Feb. 27, 2008, which claims the priority of Japanese Patent Application No. 2007-059292 filed on Mar. 9, 2007, the disclosures of which are incorporated herein by reference.

INDUSTRIAL APPLICABILITY

The present invention can be applied to various display devices that can realize image display, without being limited to a flat panel display.

The invention claimed is:

1. A clockless transmission system comprising:
    a display controller; and
    a display driver,
    wherein the display controller comprises a data transmission circuit configured to output general data obtained by multiplexing a clock by coding serialized pixel data for each pixel data during a data communication interval and also to output a predetermined control signal during a blanking interval, and
    the display driver comprises a clock and data recovery circuit configured to output the pixel data from the general data transferred from the display controller and to increase a loop gain of a feedback loop in clock recovery such that the loop gain is larger than that when the general data is received, according to control data of the control signal, to recover and output a clock, and
    a display driving circuit configured to output signals for driving a display based on the pixel data and the recovered clock.

2. The clockless transmission system of claim 1, wherein the display driver drives the display by alternately repeating the data communication interval and the blanking interval.

3. The clockless transmission system of claim 1, wherein the display driver receives the control data that is generated by using 8B10B coding for clock multiplying.

4. The clockless transmission system of claim 3, wherein a special characters in 8B10B coding is adopted as the control data.

5. The clockless transmission system of claim 4, wherein the special character comprises a toggle signal (010101 . . . ) having the same number of bits as that of pixel data obtained through data coding.

6. The clockless transmission system of claim 1, wherein the clock and data recovery circuit increases the loop gain of the feedback loop for clock recovery during the blanking interval.

7. The clockless transmission system of claim 1, wherein the clock and data recovery circuit is a PLL (Phase Locked Loop) type clock and data recovery circuit using a VCO (Voltage Controlled Oscillator) and a charge pump.

8. A clockless transmission method executed by a clockless transmission system, the method comprising:
    outputting general data obtained by multiplexing a clock by coding serialized pixel data for each pixel data during a data communication interval and also outputting a predetermined control signal during a blanking interval, in a display controller; and
    driving a display by outputting, by a clock and data recovery circuit, the pixel data from the general data in an input signal transferred from the display controller, and by recovering and outputting a clock by increasing a loop gain of a feedback loop for clock recovery such that the loop gain is larger than that when the general data is received according to control data of the control signal, in a display driver.

9. The clockless transmission method of claim 8, wherein the display driver drives the display by alternately repeating the data communication interval and the blanking interval.

10. The clockless transmission method of claim 8, wherein the display driver transmits the control data that is generated by using 8B10B coding for clock multiplying.

11. The clockless transmission method of claim 10, wherein a special character in 8B10B coding is adopted as the control data.

12. The clockless transmission method of claim 11, wherein the special character comprises a toggle signal (010101 . . . ) having the same number of bits as that of pixel data obtained through data coding.

13. The clockless transmission method of claim 8, wherein the clock and data recovery circuit increases the loop gain of the feedback loop for clock recovery during the blanking interval.

* * * * *